(12) United States Patent
Kaltalioglu et al.

(10) Patent No.: US 9,997,456 B2
(45) Date of Patent: Jun. 12, 2018

(54) INTERCONNECT STRUCTURE HAVING POWER RAIL STRUCTURE AND RELATED METHOD

(71) Applicant: GLOBALFOUNDRIES INC., Grand Cayman (KY)

(72) Inventors: Erdem Kaltalioglu, Newburgh, NY (US); Atsushi Ogino, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/220,764

(22) Filed: Jul. 27, 2016

(65) Prior Publication Data
US 2018/0033718 A1    Feb. 1, 2018

(51) Int. Cl.
*H01L 23/528* (2006.01)
*H01L 23/498* (2006.01)
*H01L 21/48* (2006.01)
*H01L 23/48* (2006.01)
*H01L 23/52* (2006.01)
*H01L 23/522* (2006.01)

(52) U.S. Cl.
CPC .......... *H01L 23/528* (2013.01); *H01L 21/486* (2013.01); *H01L 21/4846* (2013.01); *H01L 23/48* (2013.01); *H01L 23/481* (2013.01); *H01L 23/498* (2013.01); *H01L 23/49827* (2013.01); *H01L 23/49838* (2013.01); *H01L 23/49894* (2013.01); *H01L 23/52* (2013.01); *H01L 23/5226* (2013.01); *H01L 23/5286* (2013.01)

(58) Field of Classification Search
CPC ....... H01L 23/48; H01L 23/481; H01L 23/52; H01L 23/5226; H01L 23/528; H01L 23/5286
See application file for complete search history.

(56) References Cited

U.S. PATENT DOCUMENTS

| 2012/0164758 | A1  | 6/2012 | Chidambarrao et al. |
| 2012/0313217 | A1* | 12/2012 | Hung ............... H01L 23/585 257/532 |
| 2013/0256906 | A1* | 10/2013 | Mori ............... H01L 23/5384 257/774 |
| 2014/0131878 | A1* | 5/2014 | Gambino ............ H01L 23/5226 257/773 |

* cited by examiner

*Primary Examiner* — Eduardo A Rodela
(74) *Attorney, Agent, or Firm* — Yuanmin Cai; Hoffman Warnick LLC

(57) ABSTRACT

Disclosed herein is an integrated circuit (IC) including a first metal layer running in a first direction, a second metal layer running in a second direction perpendicular to the first direction, the second metal layer above the first metal layer and a third metal layer running in the first direction above the second metal layer. A viabar electrically connects the first metal layer to the third metal layer, the viabar running in the first direction wherein the viabar vertically extends from the first metal layer to the third metal layer. A method of manufacturing the IC is provided.

19 Claims, 5 Drawing Sheets

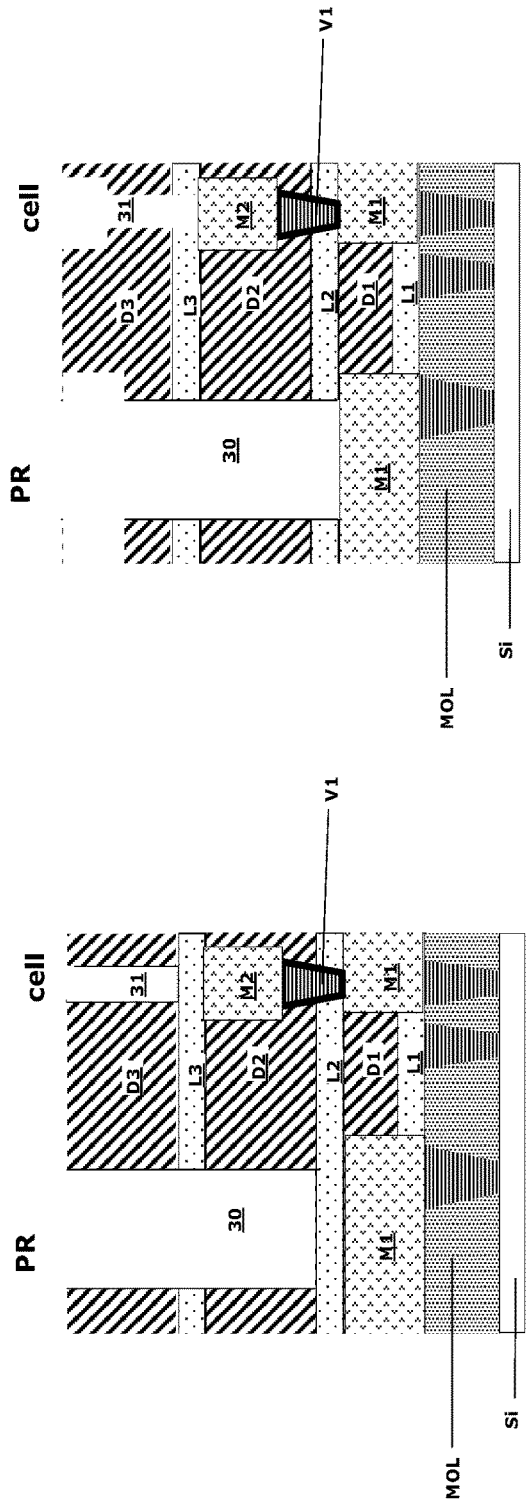

US 9,997,456 B2

INTERCONNECT STRUCTURE HAVING POWER RAIL STRUCTURE AND RELATED METHOD

TECHNICAL FIELD

The present application relates to an integrated circuit structure and a method of forming the same. More particularly, the present application relates to an interconnect structure having improved reliability and a method of forming the same.

BACKGROUND

Design systems are commonly used to layout and design integrated circuits and, in particular, to design back end of line (BEOL) interconnect structures. As advances occur, smaller widths for wires and vias are provided. For example, 7 nm node design rules may allow only bi-directional wiring at any metal layer, which precludes 2-dimensional designs in a metal layer. BEOL complies with mandated design rules. Design rule spacing constraints are imposed in BEOL interconnect structures on spacings for troughs in the dielectric material of different metallization levels (i.e., Mx-levels), which results in the reduction in via placements in power rails. These design rules preclude redundancy which lowers yield and negatively impact reliability.

BRIEF SUMMARY

A first embodiment of the present disclosure provides an integrated circuit (IC) including a first metal layer running in a first direction, a second metal layer running in a second direction perpendicular to the first direction. The second metal layer is above the first metal layer. The IC includes a third metal layer running in the first direction and above the second metal layer. The IC include a viabar electrically connecting the first metal layer to the third metal layer. The viabar has a length in the first direction. The viabar vertically extends from the first metal layer to the third metal layer.

A second embodiment of the present disclosure provides an integrated circuit (IC) including a first metal layer running in a first direction, the first metal layer disposed in a first dielectric layer, a second metal layer running in a second direction perpendicular to the first direction, the second metal layer positioned in a second dielectric layer, the second dielectric layer disposed on the first dielectric layer and a third metal layer running in the first direction, the third metal layer positioned in a third dielectric layer, the third dielectric layer disposed on the second dielectric layer. A viabar directly connects the first metal layer to the third metal layer, the viabar has a length in the first direction wherein the viabar vertically extends from the first metal layer to the third metal layer through the second dielectric layer.

A third embodiment of the present disclosure provides a method of forming an integrated circuit. The method includes providing a structure including, a first metal layer running in a first direction wherein the first metal layer is positioned in first dielectric material, a second metal layer running in a second direction perpendicular to the first direction, the second metal layer above the first metal layer wherein the second metal layer is positioned in a second dielectric material, the second dielectric material disposed on the first dielectric material and a third dielectric material disposed on the second dielectric material. The method includes etching an opening in the structure, the opening having an elongated dimension in the first direction wherein the opening extends from a top surface of the first metal layer to a top surface of the third dielectric layer. The method includes depositing a metal to fill the opening to form a viabar and a third metal layer wherein the third metal is positioned within the third dielectric material. The viabar directly electrically connects the first metal layer to the third metal layer. The viabar has a length in the first direction and the third metal layer runs in the first direction. The method includes planarizing a surface of the third dielectric material.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which:

FIG. 4 illustrates a cross-sectional view of a structure formed by embodiments of a method in forming the IC shown in FIG. 2.

FIG. 5 illustrates a cross-sectional view of a structure formed by embodiments of a method in forming the IC shown in FIG. 2.

Figure 1:
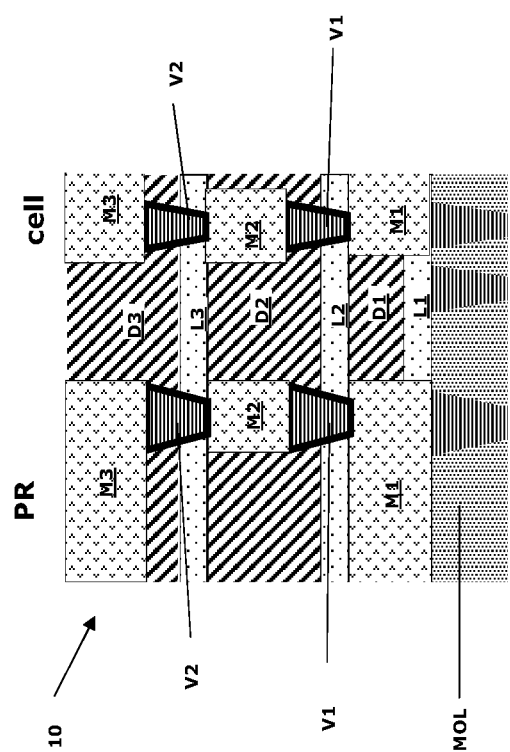
FIG. 1 illustrates a cross-sectional view of a prior art integrated circuit (IC).

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

Referring to the drawings, FIG. 1 shows a sectional view of a prior art integrated circuit (IC) 10 including three metal layers M1, M2 and M3 and intervening via layers V1 and V2. As shown, M1 is a first metal layer, V1 is via layer above first metal layer M1, electrically connecting first metal layer M1 with a second metal layer M2. A third metal layer M3 is above via layer V2. Via layer V2 connects second metal layer M2 with third metal layer M3. The IC is connected to middle of the line (MOL) through interconnects. In FIG. 1, the metal layers M1, M2 and M3 are located with dielectric layers D1, D2 and D3 respectively. Dielectric capping layers L2 and L3 are disposed on exposed surfaces to prevent migration of the atoms of interconnects. Dielectric capping layer L1 is optional.

Adjacent metal layers M1 and M2, are seen to have wiring that are directional aligned perpendicular to each other, which is typical of semiconductor designs. The term "running" is used thereby to indicate the general flow direction of current when the IC is in operation. The metal layers M1 and M3 have wiring running in parallel directions. PR refers to the power rail side of the IC and cell refers to the circuit side of the IC.

Figure 2:
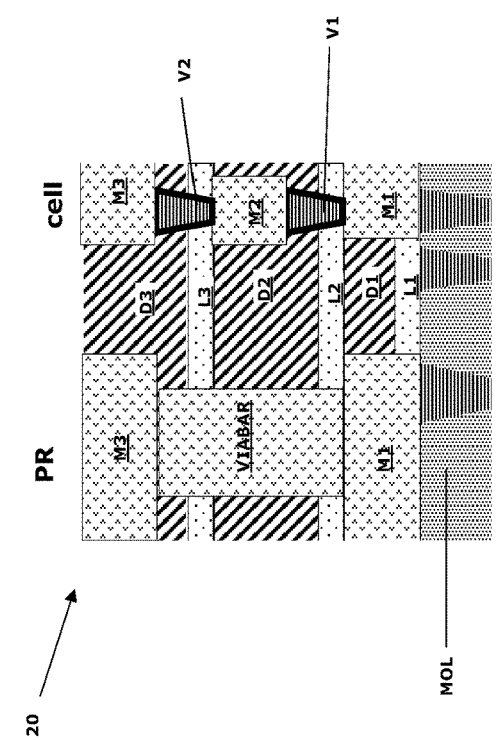
FIG. 2 illustrates a cross-sectional view of an IC according to embodiments of the present disclosure.

FIG. 2 shows an IC 20 according to various embodiments of the disclosure. Integrated circuit (IC) 20 includes three metal layers M1, M2 and M3. Metal layers M1 and M3 run in the same direction while metal layer M2 runs in a direction perpendicular to M1 and M3. M1 and M3 have flowing parallel to the paper. M2 has current flowing perpendicular to the drawing. As shown in FIG. 2, a VIABAR directly electrically connects M1 and M3. The VIABAR extends from the top surface of M1 to the bottom surface of M3 and extends in a direction parallel to M1 and M3. The current in the VIABAR runs between M1 and M3. Such an embodiment eliminates the need to use M2 and vias V1 and V2, on the power rail side of the IC, to supply power to first metal layer M1. On the circuit side of the IC, the second metal layer M2 is still used and via layer V1 connects second metal layer M2 and first metal layer M1. Via layer V2 connects second metal layer M2 and third metal layer M3. The IC is connected to middle of the line (MOL). In FIG. 2 the metal layers M1, M2 and M3 are disposed within dielectric layers D1, D2 and D3 respectively. Dielectric capping layers L2 and L3 are disposed on exposed surfaces to prevent migration of the atoms of interconnects. L1 is optional. In addition, metal layers M1, M2, M3 and via layers V1, V2 may be located anywhere within the levels of an IC. Hence, their denotation as first, second, etc., is not intended to denote a position within an IC. PR refers to the power rail side of the IC and cell refers to the circuit side of the IC. The embodiment disclosed in FIG. 2 eliminates vias V1 and V2 and metal layer M2 on the PR side of the IC. As ICs get smaller, the number of vias is reduced. By including a VIABAR, redundant vias are eliminated and the yield is improved. The VIABAR has a width of from about 2 nm to 10 nm. The length of the VIABAR in the direction parallel to M1 and M3, horizontal to the drawing, can vary in FIG. 2. In embodiments, the length is from 0.04 microns to 2 microns, or 0.5 microns to 1 micron. The height of the VIABAR is the distance between M1 and M3 and is vertical to the drawing. The length of the VIABAR is, in embodiments a greater distance than the height. The drawing are not to scale.

Figure 3:
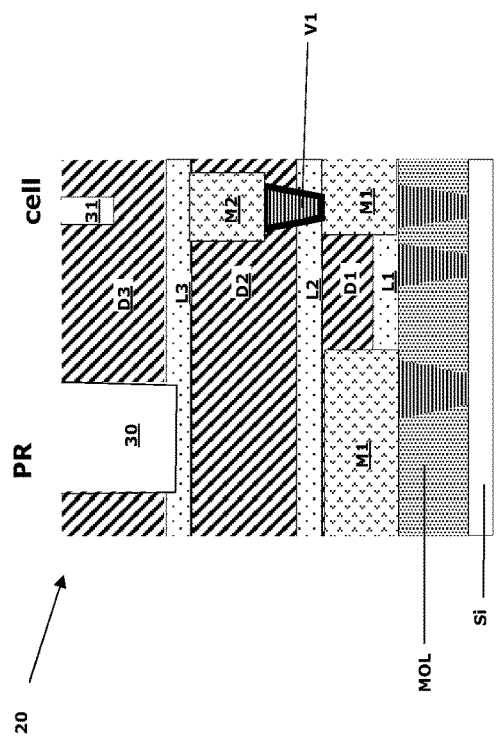
FIG. 3 illustrates a cross-sectional view of a structure formed by embodiments of a method in forming the IC shown in FIG. 2.

Referring first to FIG. 3, there is illustrated a precursor structure to that shown in FIG. 2, including a third dielectric layer D3 disposed on a dielectric capping layer L3. Dielectric capping layer L3 is disposed on a second dielectric layer D2 disposed on a second dielectric capping layer L2. At the first level there is metal layer M1. The metal layer M1 is disposed on a middle of the line (MOL) structure. The structure is disposed on a bulk silicon or silicon-on-insulator SOI wafer. An opening 30 on the PR side is etched and reaches from the surface of D3 to the dielectric capping layer L3. There is an opening 31 on the cell side that is etched and enters dielectric layer D3 but does not reach the dielectric capping layer L3. During etching, the opening 30 reaches deeper on the power rail side than the opening 31 on the cell side as there are additional layers (not shown) on the cell side.

Layers D1, D2 and D3 are dielectric materials and may include any inorganic dielectric materials, organic dielectric materials, or combinations thereof. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx® (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell).

Dielectric materials may be porous, non-porous or contain regions and/or surfaces that are porous and other regions and/or surfaces that may be non-porous. Some examples of suitable dielectrics that can be used may include, but are not limited to, silicon oxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present disclosure, dielectric materials have a dielectric constant that is about 3.0 or less, with a dielectric constant of about 2.8 or less being even more typical. As used herein, "about" or "approximately" indicate +/−10% of the value(s) stated. All dielectric constants mentioned herein are relative to a vacuum, unless otherwise noted. Dielectric materials that have dielectric constants of about 3.0 or less generally have a lower parasitic cross talk as compared with dielectric materials that have a higher dielectric constant than 4.0. The thickness of the dielectric layers D1, D2, D3 may vary depending upon the dielectric material used as well as the exact number of dielectric layers within the interconnect structure of FIG. 2. In one embodiment, and by way of an example, the dielectric layers D1, D2 and D3 may have a thickness from about 20 nm to about 1000 nm.

Dielectric capping layers L1, L2 and L3 may be deposited to prevent diffusion. The dielectric capping layer material may be composed of any dielectric material including oxides, nitrides, and/or oxynitrides. For example, the dielectric capping material for dielectric capping layers L1, L2 or L3 may be selected from silicon-containing materials, such as $SiO_2$, $Si_3N_4$, $SiO_xN_y$, SiC, SiCO, SiCOH, and/or SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and/or diamond-like carbon (DLC, also known as amorphous hydrogenated carbon, $\alpha$-C:H). In some embodiments, the dielectric capping material may be silicon oxide ($SiO_2$), silicon nitride ($Si_3N_4$), silicon oxynitride ($SiO_xN_y$), aluminum oxide ($Al_2O_3$), hafnium oxide ($HfO_2$), zirconium oxide ($ZrO_2$) or combinations and multi-layers thereof. In embodiments, the dielectric capping layer material may have a thickness ranging from 5 nm to 100 nm; although other thicknesses that are lesser than or greater than this thickness range can also be employed for the dielectric capping material.

The dielectric capping layer may be formed using a deposition process, such as, for example, chemical vapor deposition (CVD), plasma enhanced chemical vapor deposition, metal-organic chemical vapor deposition, evaporation, chemical solution deposition, spin on deposition, or physical vapor deposition (PVD).

The opening 30 in FIG. 3 may be formed as a trench with an elongated dimension parallel to M1. In some embodiments, a single opening can be formed. In embodiments, multiple openings 30 can be formed. In embodiments, the opening 30 extends from the surface of the dielectric layer D3 to the surface of dielectric capping layer L2. The opening 30 may optionally be cleaned after the etching. The opening 31 is formed during the process of forming opening 30 and extends from the surface of dielectric layer D3 into D3. In embodiments, multiple openings 31 can be formed.

As shown in FIG. 4, the structure of FIG. 3 is then subjected to a further etch to further extend opening 30 down to dielectric capping layer L2 and further extend opening 31 down to dielectric capping layer L3. At this point, an etching is conducted to remove the dielectric capping layers L2 and L3 exposed by openings 30 and 31. FIG. 5 shows the result of the etching to remove the exposed dielectric capping layers L3 and L2. On the PR side, the opening 30 extends to the upper surface of first metal layer M1. This opening can optionally be cleaned. On the cell side, the further etching extends opening 31 through dielectric capping layer L3 to the surface of M2. Openings 30 and 31 are further lengthened at the top surface of dielectric layer D3 during this etch for creating the M3 opening and are shown in FIG. 5.

Openings 30 and 31 may be formed through lithographically patterning and etching In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example, etching generally refers to the removal of material from a substrate (or structures formed on the substrate), and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features.

In embodiments, different etch processes may be used to form the openings 30 and 31 through different layers of the IC.

The openings 30 and 31 shown in FIG. 5 are subjected to a metal deposition process and a planarization process which results in IC 20 shown in FIG. 2. The VIABAR and M3 layer are filled with metal on the PR side and the via V2 and M3 layer are filled with metal on the cell side. An example of a metal deposition process can include any now known or later developed techniques appropriate for copper including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, physical vapor deposition (PVD), atomic layer deposition (ALD), plating, evaporation. In embodiments, non-selective sputtering (PVD) and plating, are generally used for metal deposition.

In embodiments conductors such as copper, aluminum, cobalt, tungsten and ruthenium can be used, although copper is typically used.

Planarization refers to various processes that make a surface more planar (that is, more flat and/or smooth) and to remove metal overfill above the D3 surface. Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

Figure 6:
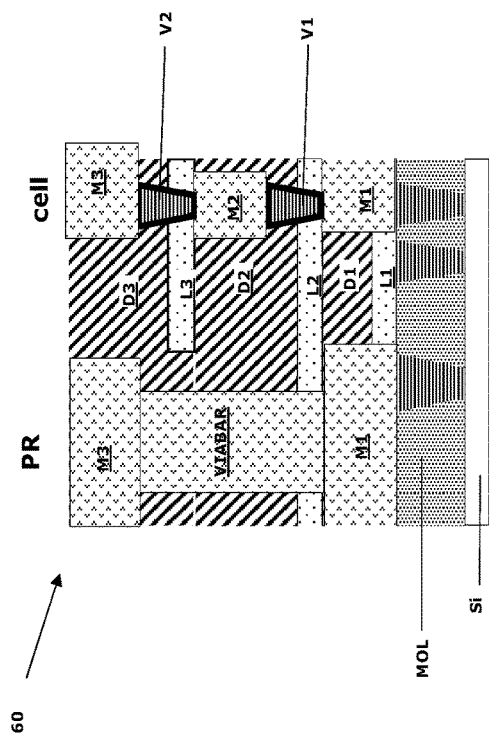
FIG. 6 illustrates a cross-sectional view of an IC according to embodiments of the present disclosure.

An embodiment of the disclosure is shown in FIG. 6. Integrated circuit (IC) 60 includes three metal layers M1, M2 and M3. Metal layers M1 and M3 run in the same direction while metal layer M2 runs in a direction perpendicular to M1 and M3. A shown in FIG. 6, a VIABAR electrically connects M1 and M3. The embodiment of FIG. 6 eliminates the need to use M2 and vias V1 and V2 to supply power to third metal layer M3. Via layer V1 connects second metal layer M2 and third metal layer M3 on the cell side. The IC 60 is connected to middle of the line (MOL) through interconnects. In FIG. 6 the metal layers M1, M2 and M3 are located with dielectric layers D1, D2 and D3 respectively. Dielectric capping layers L1, L2 and L3 are disposed on exposed surfaces to prevent migration of the atoms of interconnects. In FIG. 6 the dielectric capping layer L3 does not extend to the power rail side of the IC 60.

Figure 7:
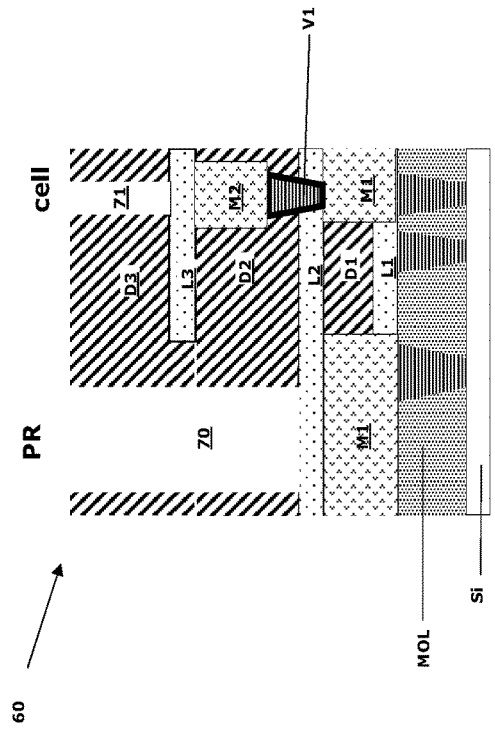
FIG. 7 illustrates a cross-sectional view of a structure formed by embodiments of a method in forming the IC shown in FIG. 6.

Referring first to FIG. 7, there is illustrated a structure including a third dielectric layer D3 disposed on a dielectric capping layer L3 on the cell side. There is no dielectric capping layer L3 on the power rail side. The third dielectric capping layer L3 is disposed on a second dielectric layer D2 disposed on a second dielectric capping layer L2 on the cell side. At the first level there is metal layer M1. The metal layer M1 is disposed on a middle end of line MOL structure. The structure is disposed on bulk silicon or a silicon-on-insulator SOI wafer.

Figure 8:
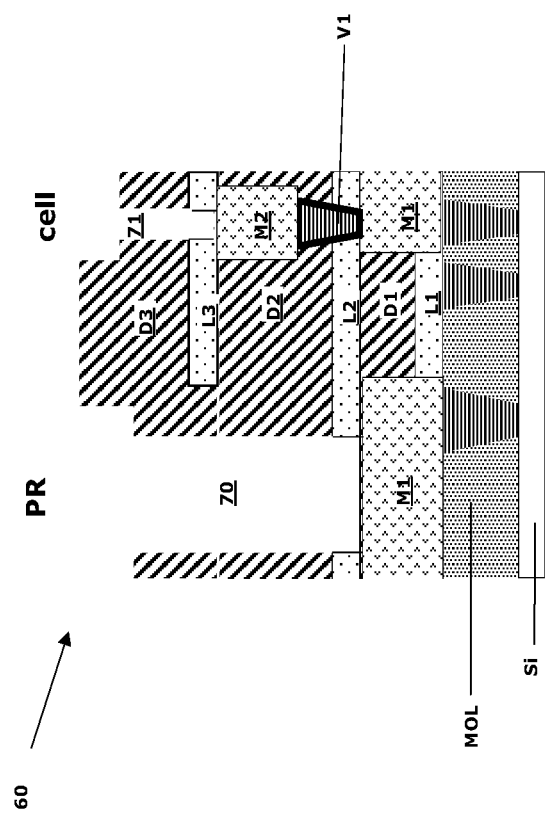
FIG. 8 illustrates a cross-sectional view of a structure formed by embodiments of a method in forming the IC shown in FIG. 6.

An opening 70 on the power rail side reaches from the surface of D3 to the dielectric capping layer L2. There is an opening 71 on the cell side reaches to dielectric capping layer L3. During etching, the opening 70 reaches to the surface of dielectric capping layer L2 on the power rail side and the opening 71 reaches to the surface of dielectric capping layer L3 on the cell side. FIG. 8 shows the result of the etching to remove the exposed dielectric capping layer L3 from opening 71 and the exposed dielectric capping layer L2 from opening 70. The opening 70 extends to the upper surface of first metal layer M1. This opening can optionally be cleaned. On the cell side, the etch extends opening 71 through dielectric capping layer L3 to the surface of M2. Openings 70 and 71 are optionally lengthened at the top surface of D3 during the removal of the dielectric capping layers L2 and L3.

The openings 70 and 71 shown in FIG. 8 are subjected to a metal deposition process and a planarization process which results in IC 60 shown in FIG. 6. The VIABAR and M3 layer are filled with metal on the PR side and the via V2 and M3 layer are filled with metal on the cell side.

The resulting IC structures described herein include viabars that provide an interlevel pass through to electrically connect a first metal layer with a third metal layer.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An integrated circuit (IC) comprising:
   a first metal layer running in a first direction;
   a second metal layer running in a second direction perpendicular to the first direction, the second metal layer being above the first metal layer;
   a third metal layer running in the first direction above the second metal layer; and
   a viabar directly electrically connecting the first metal layer to the third metal layer, the viabar having a length in the first direction wherein the viabar has a height that vertically extends from the first metal layer to the third metal layer on a power rail side of the IC, wherein the length of the viabar is greater than the height of the viabar, wherein the viabar has width of from about 2 nm to 10 nm.

2. The IC of claim 1, wherein the viabar comprises copper.

3. The IC of claim 1, wherein the first metal layer is positioned in a first dielectric layer.

4. The IC of claim 3, wherein the second metal layer is positioned in a second dielectric layer.

5. The IC of claim 4, wherein the second dielectric is disposed on the first dielectric layer.

6. The IC of claim 5, wherein the third metal layer is positioned in a third dielectric layer.

7. The IC of claim 6, wherein the third dielectric layer is disposed on the second dielectric layer.

8. The IC of claim 1, wherein the first metal layer, the second metal layer and the third metal layer are selected from the group consisting of: copper, aluminum, cobalt, tungsten and ruthenium.

9. The IC of claim 8, wherein the first metal layer, the second metal layer and the third metal layer are selected from the group consisting of: copper, aluminum, cobalt, tungsten and ruthenium.

10. An integrated circuit (IC) comprising:
    a first metal layer running in a first direction, the first metal layer disposed in a first dielectric layer;
    a second metal layer running in a second direction perpendicular to the first direction, the second metal layer positioned in a second dielectric layer, the second dielectric layer disposed on the first dielectric layer;
    a third metal layer running in the first direction, the third metal layer positioned in a third dielectric layer, the third dielectric layer disposed on the second dielectric layer;
    a first dielectric capping layer disposed between the third dielectric layer and the second dielectric layer extending on a cell side of the IC; and
    a viabar directly connecting the first metal layer to the third metal layer, the viabar having a length in the first direction wherein the viabar vertically extends from the first metal layer to the third metal layer through the second dielectric layer on a power rail side of the IC, wherein the length of the viabar is greater than the height of the viabar.

11. The IC of claim 10, further comprising a second dielectric capping layer disposed between the first dielectric layer and the second dielectric layer.

12. The IC of claim 11, wherein the first dielectric capping layer and the second dielectric capping layer comprise a material selected from the group consisting of: silicon oxide ($SiO_2$), silicon nitride ($Si_3N_4$), silicon oxynitride ($SiO_xN_y$), aluminum oxide ($Al_2O_3$), hafnium oxide ($HfO_2$), zirconium oxide ($ZrO_2$), silicon carbide (SiC), SiCO compound, SiCOH compound, SiCH compounds and amorphous hydrogenated carbon ($\alpha$-C:H).

13. The IC of claim 10, wherein the viabar comprises copper.

14. An integrated circuit (IC) comprising:
a first metal layer running in a first direction;
a second metal layer running in a second direction perpendicular to the first direction, the second metal layer being above the first metal layer;
a third metal layer running in the first direction above the second metal layer; and
a viabar directly electrically connecting the first metal layer to the third metal layer, the viabar having a length in the first direction, the viabar having a height, wherein the viabar extends vertically from the first metal layer to the third metal layer on a power rail side of the IC, and wherein the length of the viabar is greater than the height of the viabar.

15. The IC of claim 14, wherein the first metal layer is positioned in a first dielectric layer.

16. The IC of claim 15, wherein the second metal layer is positioned in a second dielectric layer.

17. The IC of claim 16, wherein the second dielectric is disposed on the first dielectric layer.

18. The IC of claim 17, wherein the third metal layer is positioned in a third dielectric layer.

19. The IC of claim 18, wherein the third dielectric layer is disposed on the second dielectric layer.

* * * * *